United States Patent
Pan et al.

(10) Patent No.: US 8,692,322 B2
(45) Date of Patent: Apr. 8, 2014

(54) FLEXIBLE CRSS ADJUSTMENT IN A SGT MOSFET TO SMOOTH WAVEFORMS AND TO AVOID EMI IN DC-DC APPLICATION

(75) Inventors: Ji Pan, San Jose, CA (US); Daniel Ng, Campbell, CA (US); Anup Bhalla, Santa Clara, CA (US); Xiaobin Wang, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/539,330

(22) Filed: Aug. 26, 2012

(65) Prior Publication Data

US 2013/0001683 A1 Jan. 3, 2013

Related U.S. Application Data

(60) Continuation-in-part of application No. 12/583,192, filed on Aug. 14, 2009, now Pat. No. 8,236,651, and a continuation-in-part of application No. 12/583,191, filed on Aug. 14, 2009, now Pat. No. 8,193,580, and a continuation-in-part of application No. 13/016,804, filed on Jan. 28, 2011, and a continuation-in-part of application No. 13/066,947, filed on Apr. 28, 2011, now Pat. No. 8,431,989, which is a division of application No. 11/356,944, filed on Feb. 17, 2006, now Pat. No. 7,633,119, and a division of application No. 12/653,355, filed on Dec. 11, 2009, now Pat. No. 7,936,011.

(51) Int. Cl.
*H01L 27/088* (2006.01)

(52) U.S. Cl.
USPC .................................. 257/334; 257/E27.06

(58) Field of Classification Search
None
See application file for complete search history.

(56) References Cited

U.S. PATENT DOCUMENTS

| | | | | |
|---|---|---|---|---|
| 7,453,119 B2 * | 11/2008 | Bhalla et al. | | 257/330 |
| 7,936,011 B2 * | 5/2011 | Bhalla et al. | | 257/330 |
| 8,431,989 B2 * | 4/2013 | Bhalla et al. | | 257/330 |
| 2002/0056884 A1 * | 5/2002 | Baliga | | 257/492 |

* cited by examiner

*Primary Examiner* — Seahvosh Nikmanesh
(74) *Attorney, Agent, or Firm* — Bo-In Lin

(57) ABSTRACT

A semiconductor power device comprises a plurality of power transistor cells each having a trenched gate disposed in a gate trench wherein the trenched gate comprising a shielding bottom electrode disposed in a bottom portion of the gate trench electrically insulated from a top gate electrode disposed in a top portion of the gate trench by an inter-electrode insulation layer. At least one of the transistor cells includes the shielding bottom electrode functioning as a source-connecting shielding bottom electrode electrically connected to a source electrode of the semiconductor power device and at least one of the transistor cells having the shielding bottom electrode functioning as a gate-connecting shielding bottom electrode electrically connected to a gate metal of the semiconductor power device.

13 Claims, 18 Drawing Sheets

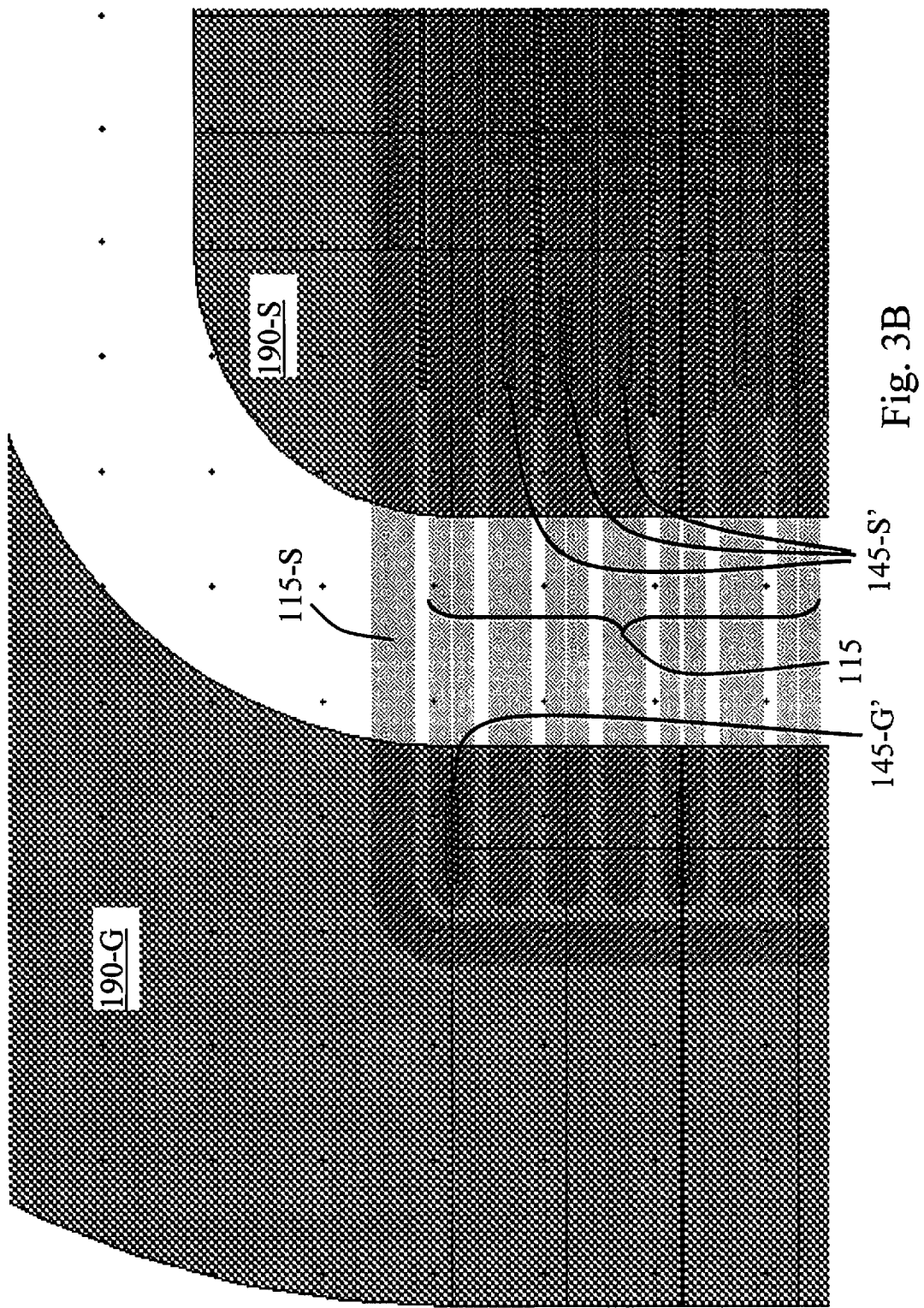

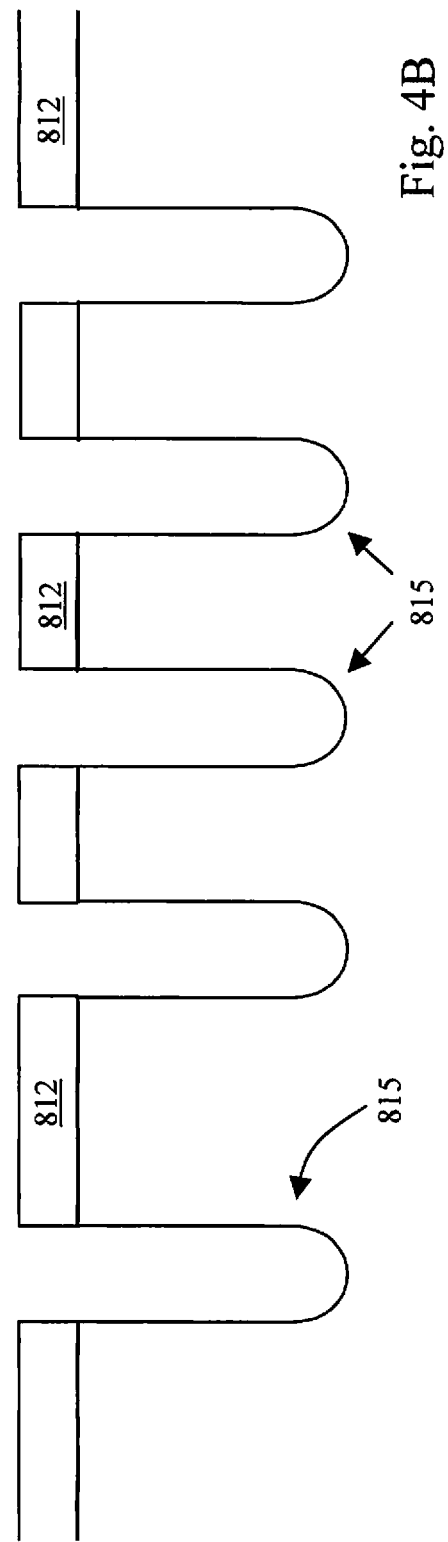

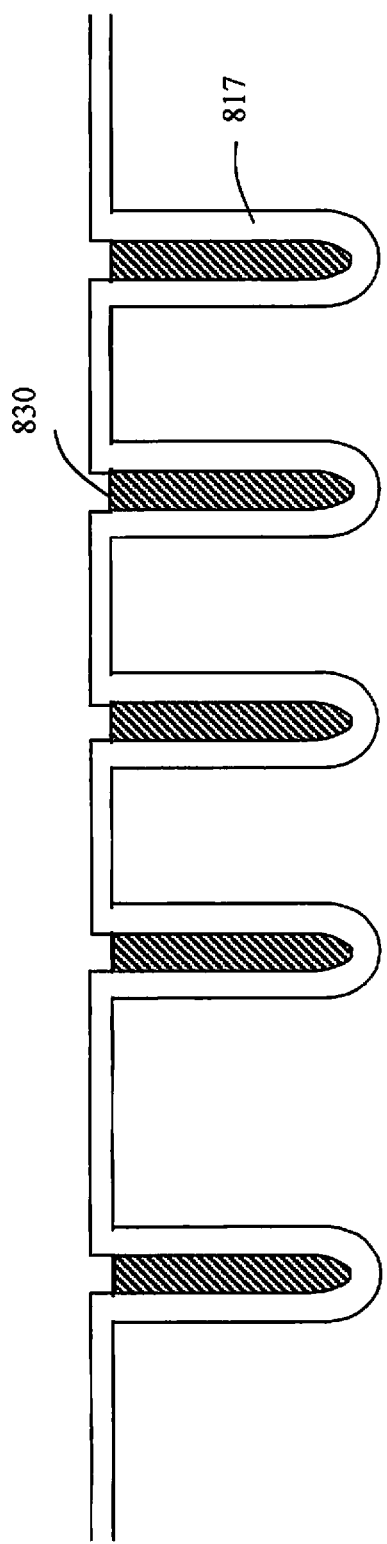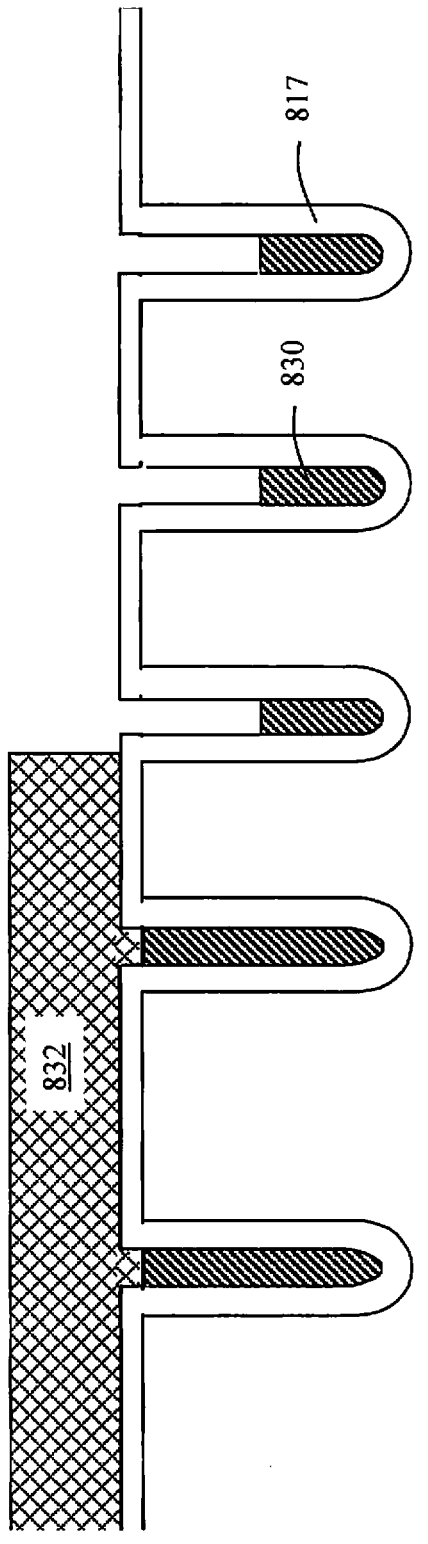
Fig. 4E
Fig. 4F

FLEXIBLE CRSS ADJUSTMENT IN A SGT MOSFET TO SMOOTH WAVEFORMS AND TO AVOID EMI IN DC-DC APPLICATION

This Patent Application is a Continuation in Part (CIP) Application of three applications Ser. No. 12/583,192 filed on Aug. 14, 2009 now issued into U.S. Pat No. 8,236,651 on Aug. 7, 2012; Ser. No. 12/583,191 filed on Aug. 14, 2009 now issued into U.S. Pat. No. 8,193,580 on Jun. 5, 2012 and Ser. No. 13/016,804 filed on Jan. 28, 2011 by a common inventor of this Application. This Application is also a Continuation in Part (CIP) Application of Applications of another application Ser. No. 13/066,947 filed on Apr. 28, 2011 now issued into U.S. Pat. No. 8,431,989 on Apr. 7, 2013 by a common inventor of this Application. application Ser. No. 13/066,947 is a Divisional Application and claims the Priority Date of another application Ser. No. 11/356,944 filed on Feb. 17, 2006 now issued into U.S. Pat. No. 7,633,119 and application Ser. No. 12/653,355 filed on Dec. 11, 2009 by common Inventors of this Application and now issued to U.S. Pat. No. 7,936,011. The Disclosures made in the patent applications Ser. Nos. 11/356,944, 12/653,355 12/583,192, 12/583,191, 13/016,804 and 13/066,947 are hereby incorporated by reference.

BACKGROUND OF THE INVENTION

1. Field of the Invention

The invention relates generally to the semiconductor power devices. More particularly, this invention relates to an improved and novel manufacturing process and device configuration for providing the power device with flexible Crss adjustment to smooth the waveforms and to avoid electromagnetic interference (EMI) in the shield gate trench (SGT) MOSFET for enhanced DC-DC applications.

2. Description of the Prior Art

Conventional technologies for designing and manufacturing power devices for DC-DC application are still confronted with a difficulty due to a reduced voltage peak of the phase node particularly for DC-DC devices of higher efficiency that requires the voltage peak of phase node to be lower than 80% drain-to-source voltage (VDS) rating to avoid the electromagnetic interference (EMI). These technical issues often limit and adversely affect the device performance.

Furthermore, conventional technologies for reducing the gate to drain capacitance Cgd in a power semiconductor device by implementing the shielded gate trench (SGT) configuration are still confronted with other technical limitations and difficulties. Specifically, the source electrode disposed on the trench bottom in the conventional SGT devices are connected to the source voltage through an edge area of the semiconductor power device. This inevitably increases the source electrode resistance. Furthermore, the extra masks needed to create such connection also increase the cost of manufacturing. Many patented inventions have disclosed such configurations.

Baliga discloses in U.S. Pat. No. 5,998,833 a DMOS cell as shown in FIG. 1A. A source electrode is placed underneath the trenched gate to reduce the gate-to-drain capacitance. The gate of the DMOS cell is divided into two segments. The gate-to-drain capacitance is reduced because the contributions to capacitance from the gate-drain overlapping areas are eliminated.

In U.S. Pat. No. 6,690,062, a MOSFET device as shown in FIG. 1B is disclosed where the switching behavior of a transistor configuration is improved by providing a shielding electrode in an edge region. The shielding electrode surrounds at least sections of an active cell array. There is a capacitance between an edge gate structure and a drain zone. The shielding electrode located in the edge region reduces the capacitance between an edge gate structure and a drain zone hence reduces the gate-drain capacitance $C_{GD}$ of the transistor.

In U.S. Pat. No. 6,891,223, Krumrey et al. disclose a transistor that includes transistor cells disposed along trenches in a semiconductor substrate with two or more electrode structures disposed in the trenches. Furthermore, metallization structures are disposed above the substrate surface as shown in FIG. 1C. The trenches extend into an inactive edge region of the transistor. An electrical connection between the electrode structures and corresponding metallization are established in the edge regions.

However, the above patented-disclosures including transistor configurations still have the common difficulty that the source electrode disposed on the trench bottom in the conventional SGT devices are connected to the source voltage through an edge area of the semiconductor power device. As there are growing demands for high frequency switch power devices, an urgent need exists to provide effective solutions to achieve the purpose of resolving these technical difficulties and limitations. For power transistors including MOSFET and IGBT, a new device configuration and manufacturing process are necessary to reduce the speed-limiting capacitance between the gate and the drain of these switching power devices.

Additionally, there is a need to improve on the conventional configuration by connecting the shielding electrode underneath the top gate segment to the source to satisfy the reduced voltage peak requirement of the phase node and to avoid the EMI issues in the power devices for the DC-DC applications.

Therefore, there is a need in the art of power semiconductor device design and manufacture to provide new manufacturing method and device configuration in forming the power devices such that the above discussed problems and limitations can be resolved.

SUMMARY OF THE PRESENT INVENTION

It is therefore an aspect of the present invention to provide a new and improved semiconductor power device implemented with the shielded gate trench (SGT) structure that has some of the bottom-shielding electrodes connected to the source metal and some of the bottom shielding electrodes connected to the gate metal to satisfy the reduced voltage peak requirement of the phase node and to avoid the EMI issues in the power devices for the DC-DC applications such that the above discussed difficulties are resolved.

Specifically, one aspect of the present invention is to provide a new and improved semiconductor power device implemented with the shielded gate trench (SGT) structure that has some of the bottom-shielding electrodes connected to the source metal and some of the bottom shielding electrodes connected to the gate metal. The new configuration is implemented in the low side MOSFET to increase Crss thus causing some of the cells to shoot through and that in turns achieve the goal of reducing the phase node peak ring.

Another aspect of the present invention is to provide a new and improved semiconductor power device implemented with the shielded gate trench (SGT) structure that has some of the bottom-shielding electrodes connected to the source metal and some of the bottom shielding electrodes connected to the gate metal. The new configuration is implemented in the high side MOSFET to increase Crss thus resulting in a slower switching speed of the high side MOSFET and that in turns achieve the goal of reducing the phase node peak ring.

Another one aspect of the present invention is to provide a new and improved semiconductor power device implemented with the shielded gate trench (SGT) structure that has some of the bottom-shielding electrodes connected to the source metal and some of the bottom shielding electrodes connected to the gate metal and by adjusting the number of bottom electrodes connected to the gate metal, the Crss may be flexibly adjusted to achieve different design goals for different types of applications.

Briefly in a preferred embodiment this invention discloses a semiconductor power device comprising a plurality of power transistor cells each having a trenched gate disposed in a gate trench wherein the trenched gate comprising a shielding bottom electrode disposed in a bottom portion of the gate trench electrically insulated from a top gate electrode disposed at a top portion of the gate trench by an inter-electrode insulation layer. At least one of the transistor cells includes the shielding bottom electrode functioning as a source-connecting shielding bottom electrode electrically connected to a source metal of the semiconductor power device and at least one of the transistor cells having the shielding bottom electrode functioning as a gate-connecting shielding bottom electrode electrically connected to a gate metal of the semiconductor power device.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 3A and 3B are two top views for showing different ratio of shielding bottom electrodes in the SGT MOSFET cells are electrically connected to the gate and to the source.

DETAILED DESCRIPTION OF THE METHOD

Figure 1A:
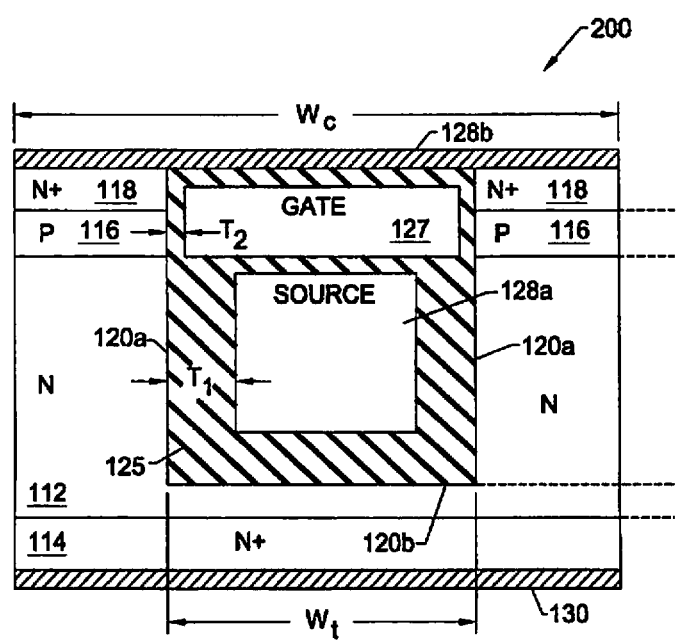
FIGS. 1A to 1C are cross sectional views of trenched MOSFET devices disclosed in patented disclosures for reducing gate-drain capacitance.
Figure 1B:
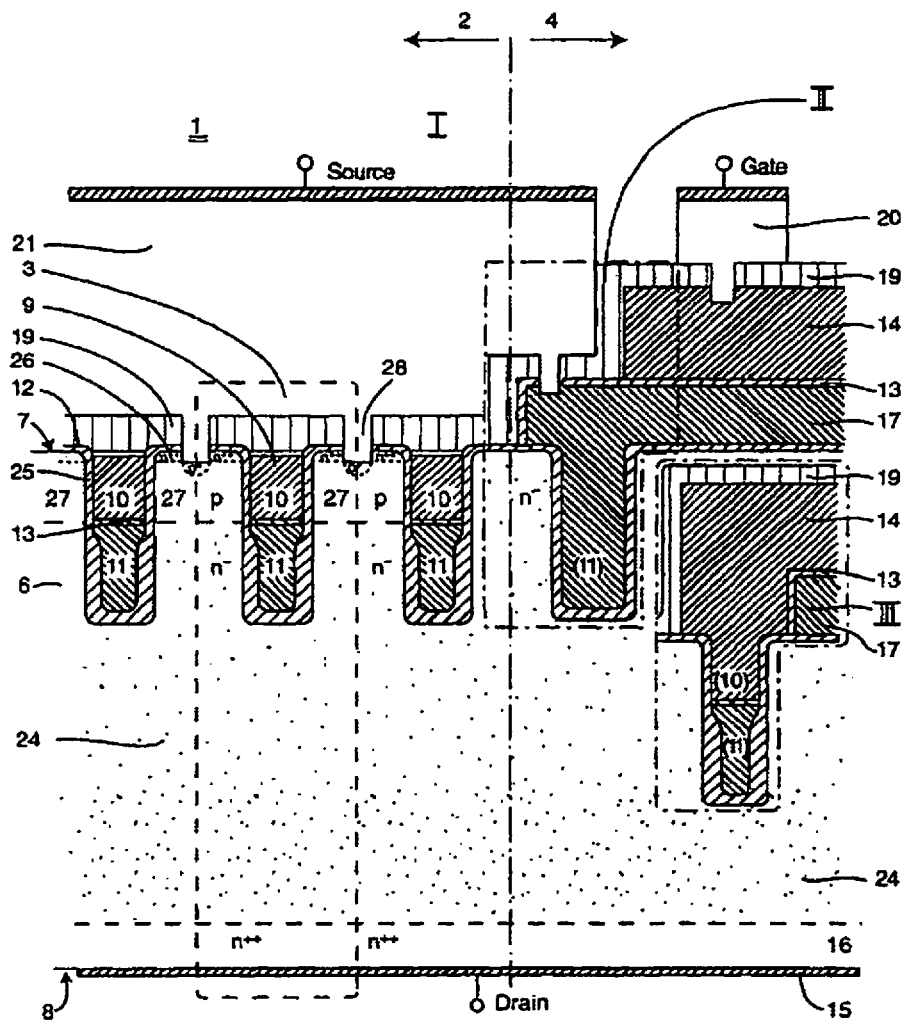
Figure 1C:
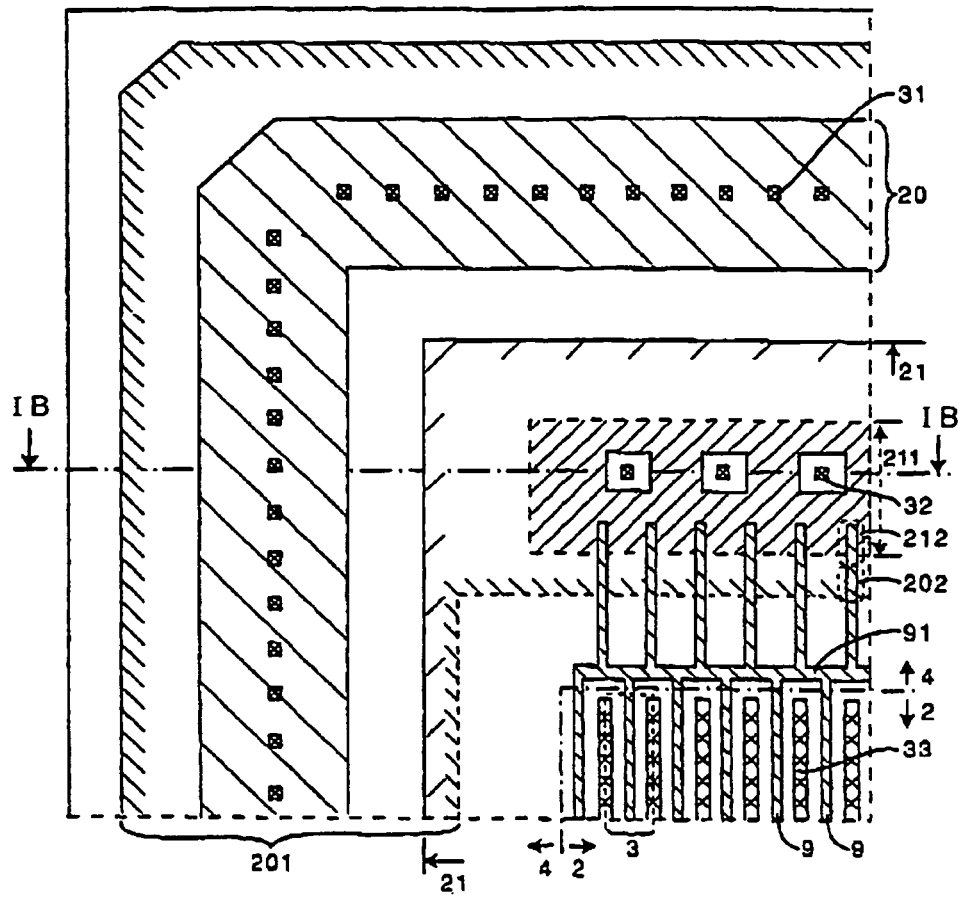
Figure 2A:
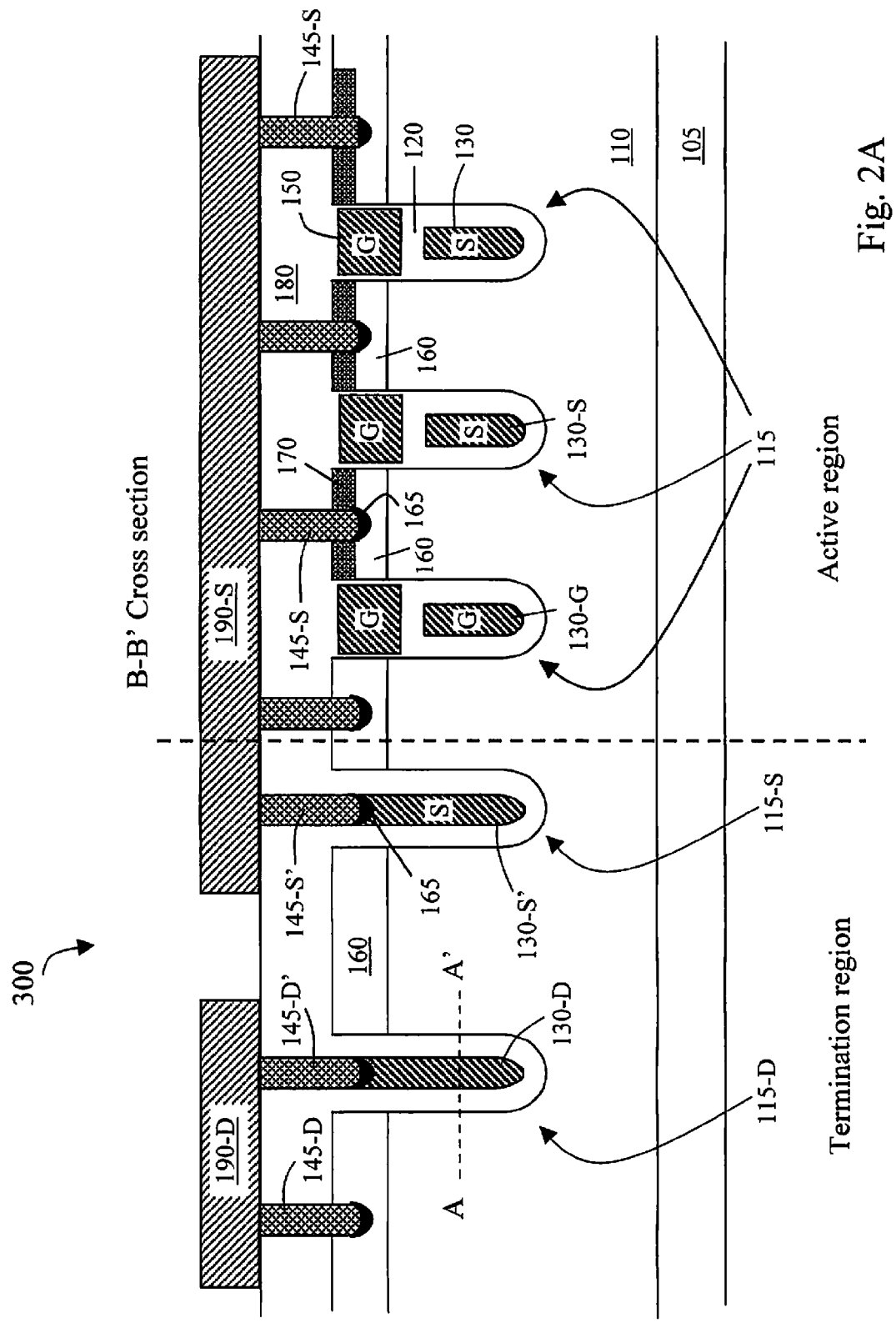
FIGS. 2A-2C are cross sectional views of portions of a trenched MOSFET device implemented with improved layout configuration of this invention.

FIG. 2A is a cross sectional view of a portion of a shielded gate trench (SGT) MOSFET power device 300 with a new layout of this invention. As shown in FIG. 2A, which is cross sectional diagram along line A-A' and B-B' of FIG. 3A, SGT MOSFET 300 is built on a silicon substrate including a lightly doped epitaxial layer 110 supported by a heavily doped layer 105. An active area of the structure includes active gate trenches such as 115, in which a gate electrode 150 is formed at a top portion of the trench and a bottom-shielding electrode 130 is formed at a bottom portion of the trench and is insulated from the gate electrode 150 by a dielectric layer 120. The SGT MOSFET device 300 also includes source poly trench 115-S formed in the termination region closed to the active region. The SGT MOSFET device 300 also includes dummy poly trench 115-D, which is also formed in the termination region. In the active area, the source metal 190-S is insulated from gate electrode 150 by a dielectric layer such as oxide 180. Source metal layer 190-S electrically connects to source regions 170 and body regions 160 through a metal conductor 145-S such as Tungsten plug that fills the source body contact openings and extends from source metal penetrating through the source regions 170 into the body regions 160. The top surfaces of gate electrode 150 are recessed below the top surface of the source regions 170. The source poly trench 115-S, form in the termination region, includes a source electrode 130-S' that is electrically connected to the source metal 190-S via a metal conductor 145-S' such as a tungsten plug filling a contact opening within the oxide 180. A contact dopant region 165 is implanted through the source contact openings opened through the oxide layer 180 to enhance the electrical contact of the tungsten plugs 145-S, 145-S' to the source regions 170 and body regions 160. The dummy trench 115-D includes a dummy poly 130-D that is electrically connected to the drain metal 190-D via a metal conductor 145-D'. The metal conductor 145-D is also connected to drain metal 190-D. The dummy poly trench 115-D and the metal conductor 145-D work as a channel stop for the device 300, which is also shown in FIG. 3C.

Figure 2B:
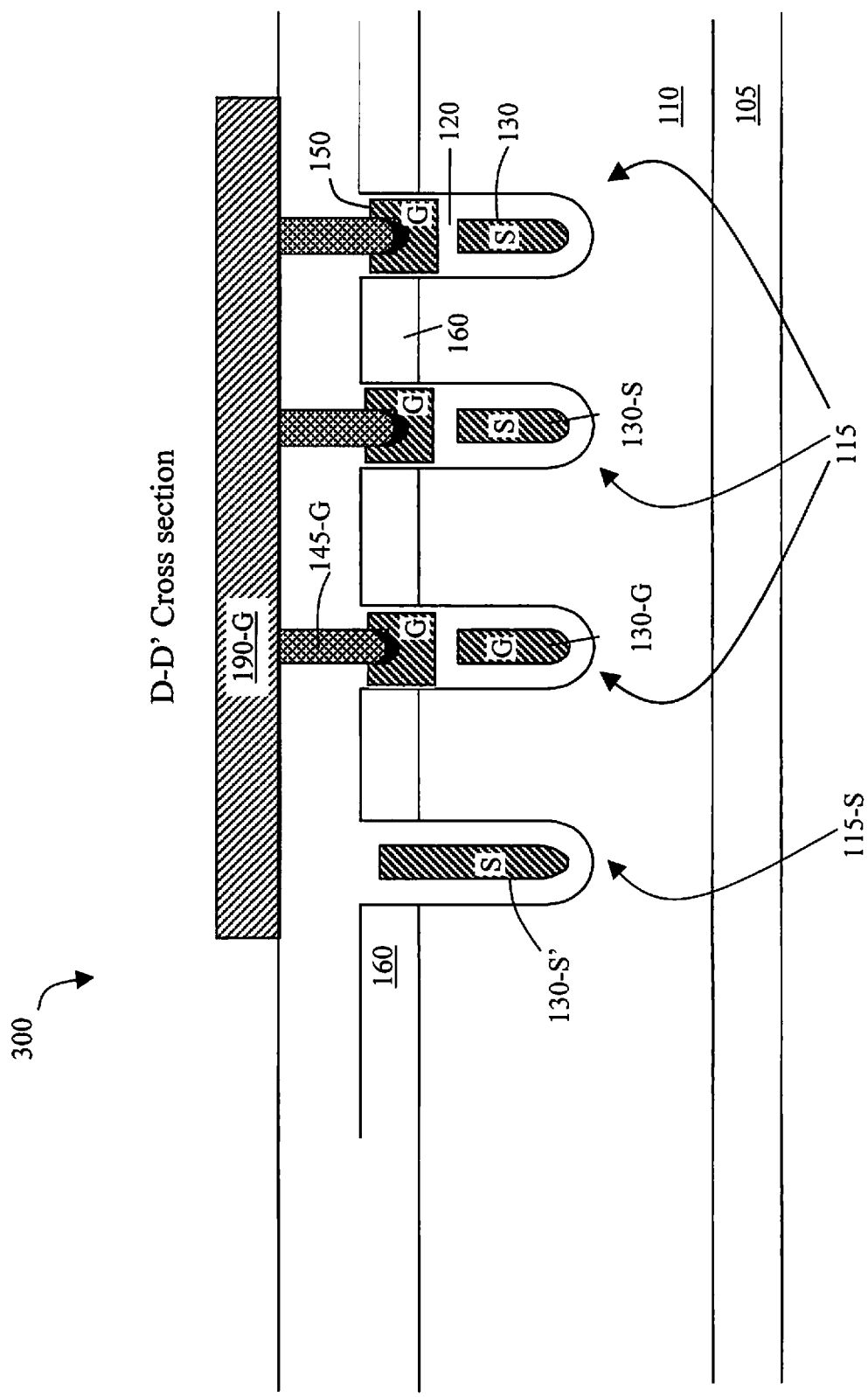

FIG. 2B is a cross sectional view of a portion along a third direction of the shielded gate trench (SGT) MOSFET power device 300 in a termination region. As shown in FIG. 2B, which is a cross sectional diagram along line D-D' of FIG. 3C, a gate runner metal 190-G electrically connects to gate electrode 150 in the extended trench gate 115, or gate runner trench, along a third dimension in the termination region through a metal conductor 145-G.

Figure 2C:
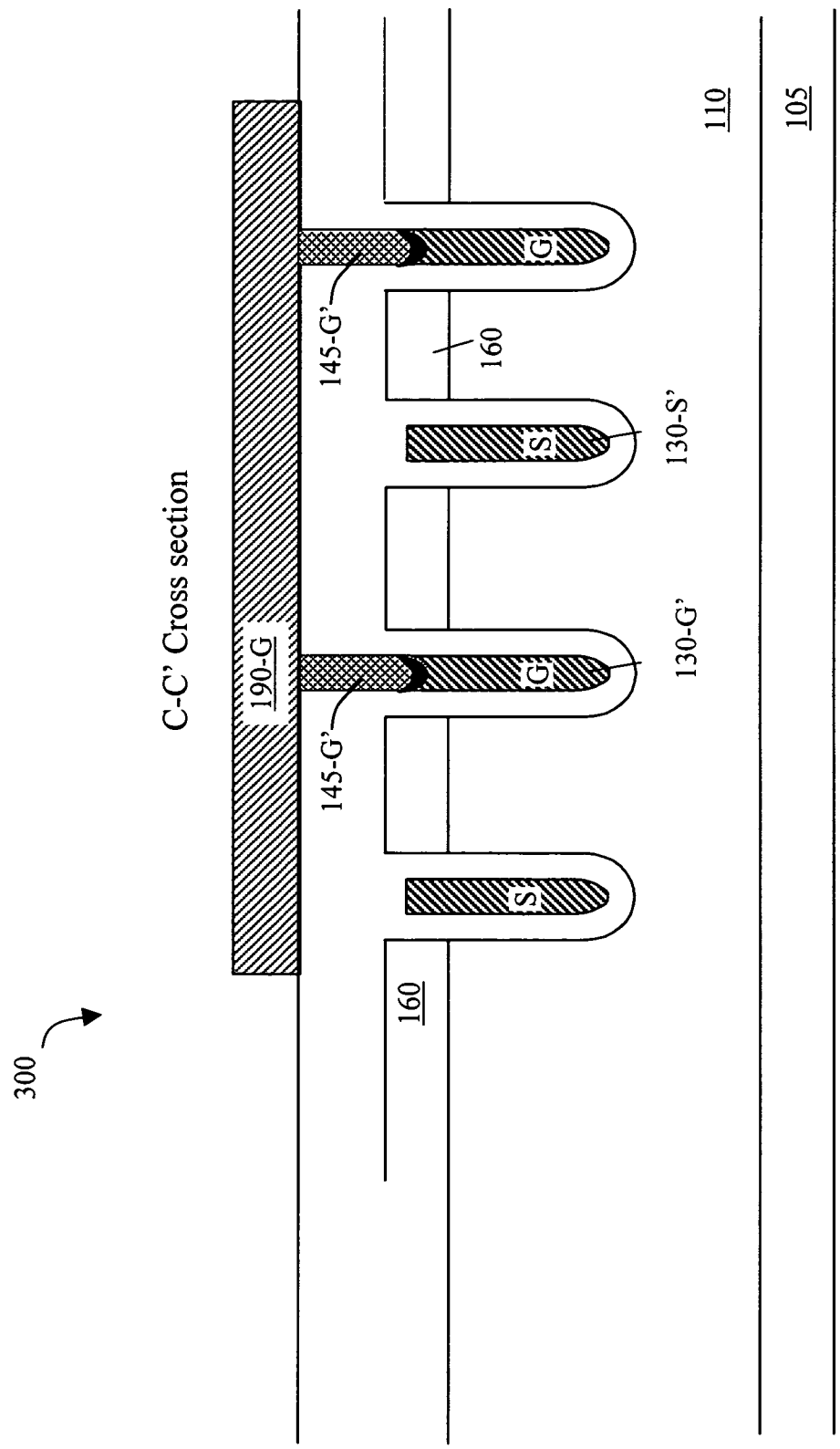

In the present invention, most of the shielding bottom electrodes of the active trenches 115, such as 130-S, are electrically connected to the source metal 190-S while some other shielding bottom electrodes, such as 130-G, are electrically connected to the gate metal 190-G. As shown in FIG. 2A, the shielding bottom electrodes 130-S are electrically connected to the source metal 190-S through source electrode 130-S' formed in the source poly trench 115-S and the metal conductor 145-S'. As shown in FIG. 2C, which is cross sectional diagram along line C-C' of FIG. 3A, the shielding bottom electrodes 130-G are electrically connected to the gate metal 190-G via the gate electrode 130-G' and the metal conductor 145-G' in the termination region a third dimension. By shorting some of the shielding bottom electrodes to the gate metal, the Crss of the SGT MOSFET device 300 is increased due to more gate-drain overlap. Crss of the SGT MOSFET device 300 can be flexibly adjusted by adjusting the number of cells having the shielding bottom electrodes connected to the gate metal, thus the RdsA of the device has no impact regardless of layout change.

Figure 3A:
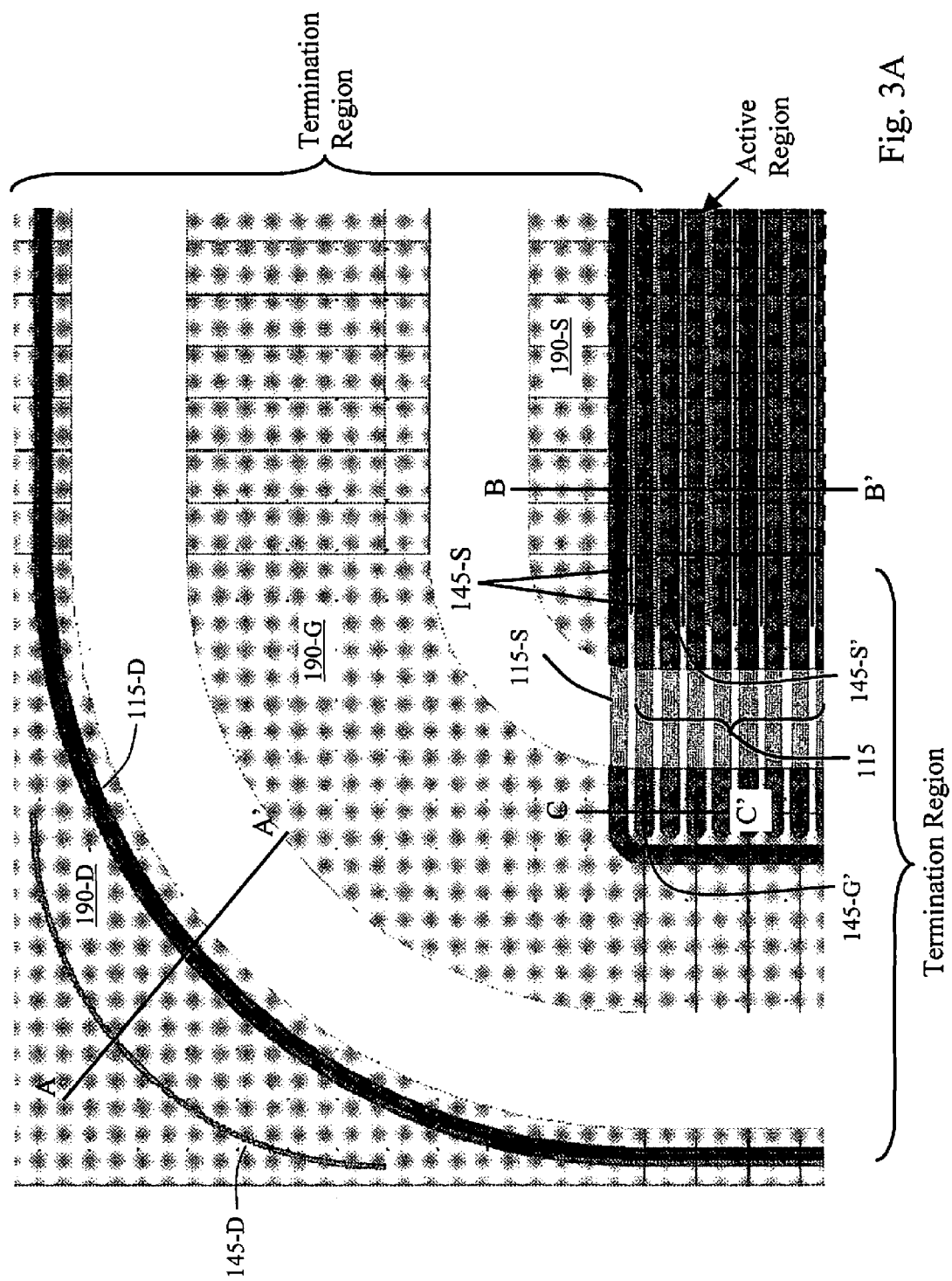
Figure 3C:
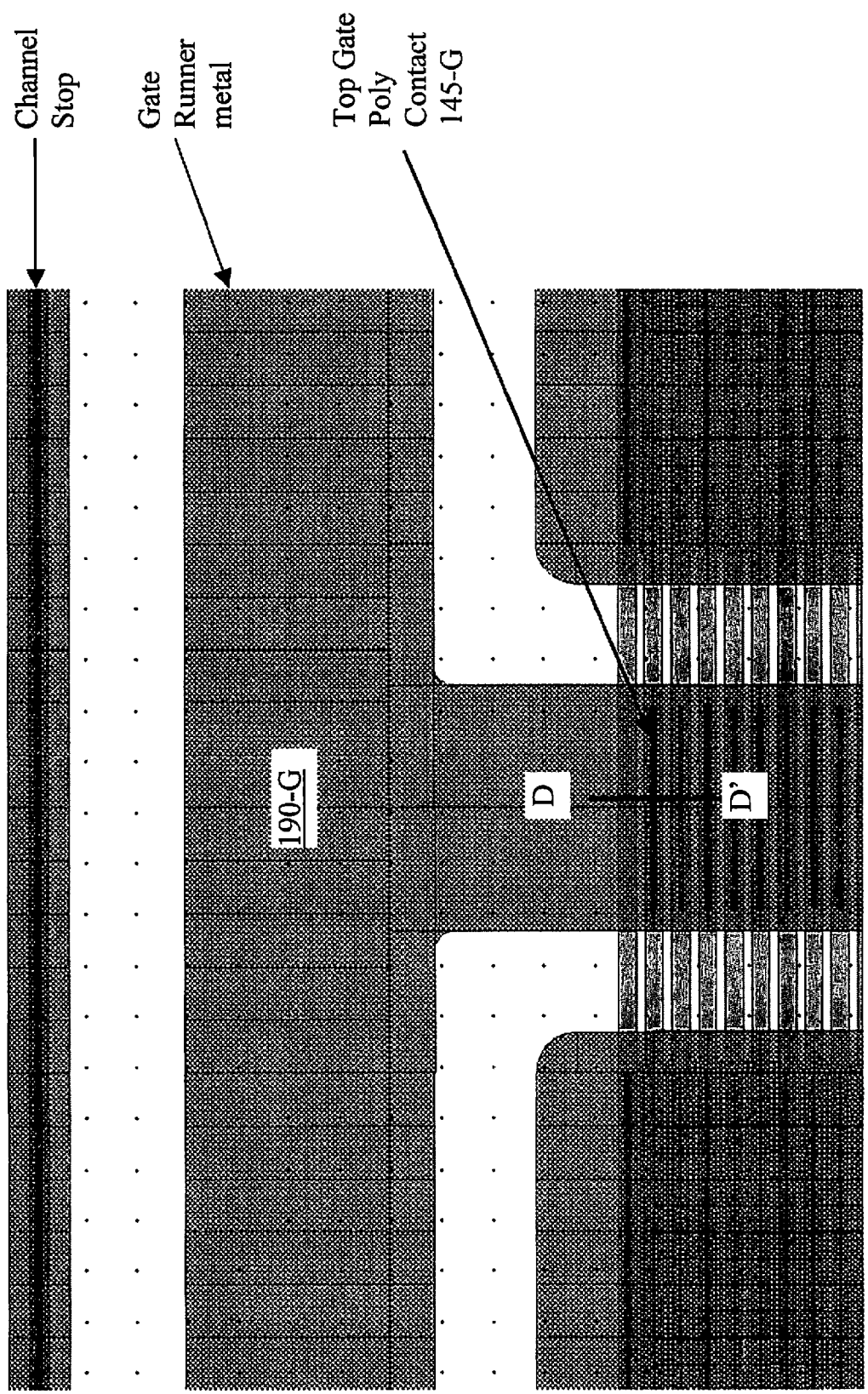
FIG. 3C is a top view showing the electrical connection of the top gate electrode to the gate runner metal through a gate contact.

FIGS. 3A and 3B are top views of two examples showing two different layout configurations. As shown in FIG. 3A, 50% of the cells have the shielding bottom electrodes configured as 130-G and connected to the gate metal 190-G and the remainder of the shielding bottom electrodes are 130-S connected to the source metal 190-S. Particularly, for each cell having shielding bottom electrodes 130-S shorted to the source metal 190-S, there is one cell having shielding bottom electrode 130-G shorted to the gate metal 190-G.

FIG. 3B shows 25% of the cells have the shielding bottom electrodes configured as 130-G and connected to the gate metal 190-G and the remainder of the shielding bottom electrodes are 130-S connected to the source metal 190-S. Particularly, for three cells having shielding bottom electrodes 130-S shorted to the source metal 190-S, there is one cell having shielding bottom electrode 130-G shorted to the gate metal 190-G. The ratio of number of cells having bottom electrodes shorted to the source metal and number of cells having bottom electrodes shorted to the gate metal may be flexibly adjusted and preferably from 1% to 50%. The device layout of the present invention with some shielding bottom electrode connected to the gate potential results in more accumulation area thus reduces the Rdson than standard SGT devices that have all the shielding bottom electrodes connected to the source potential.

Figure 4C:
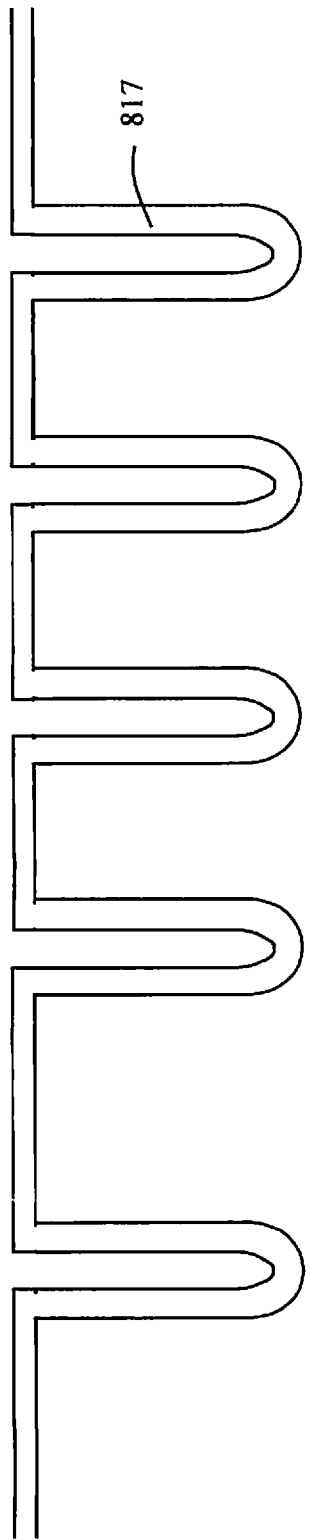
FIGS. 4A to 4P are a serial cross sectional views for describing a manufacturing process to provide a trenched MOSFET device as shown in FIG. 2A.
Figure 4D:
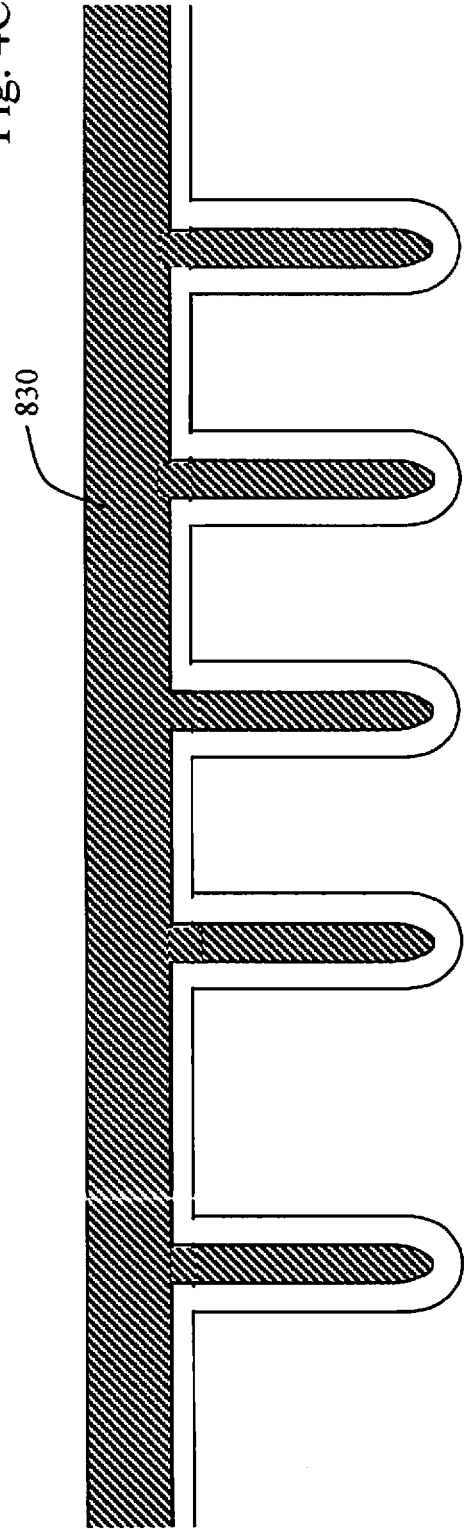
Figure 4G:
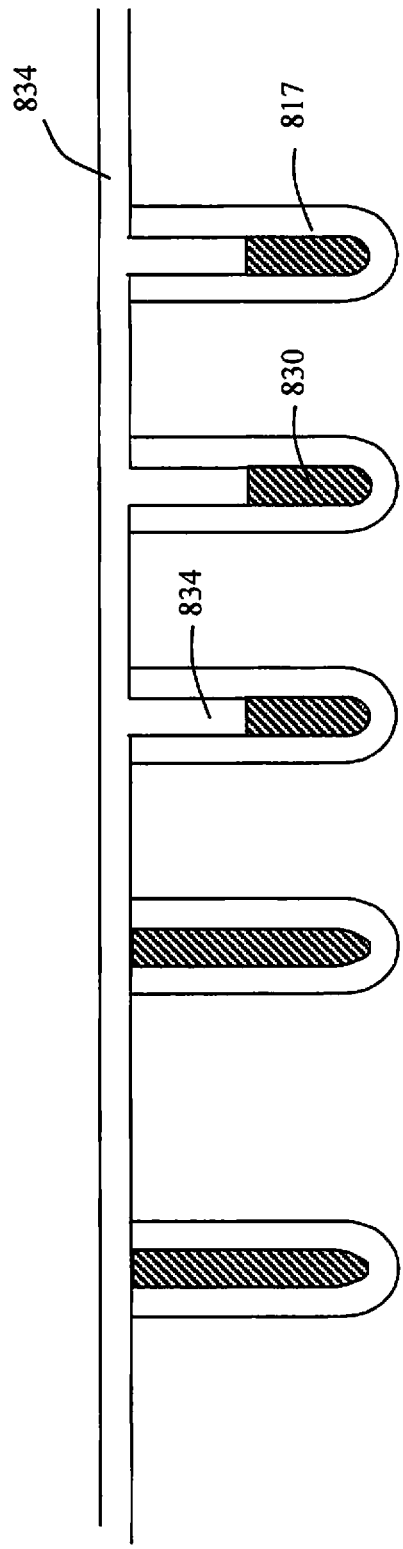
Figure 4H:
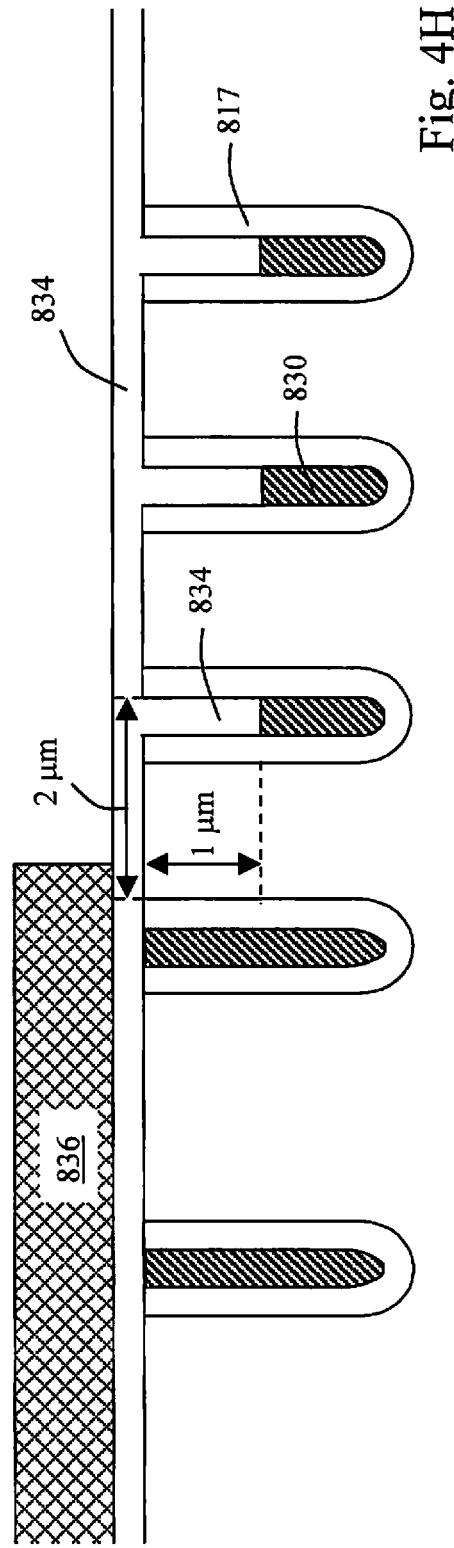
Figure 4I:
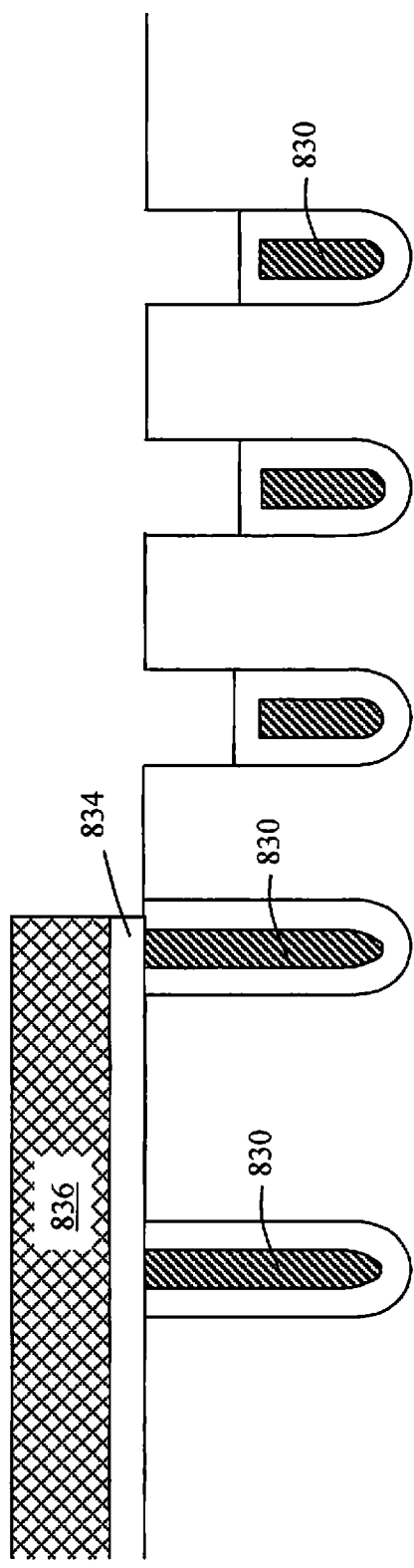
Figure 4J:
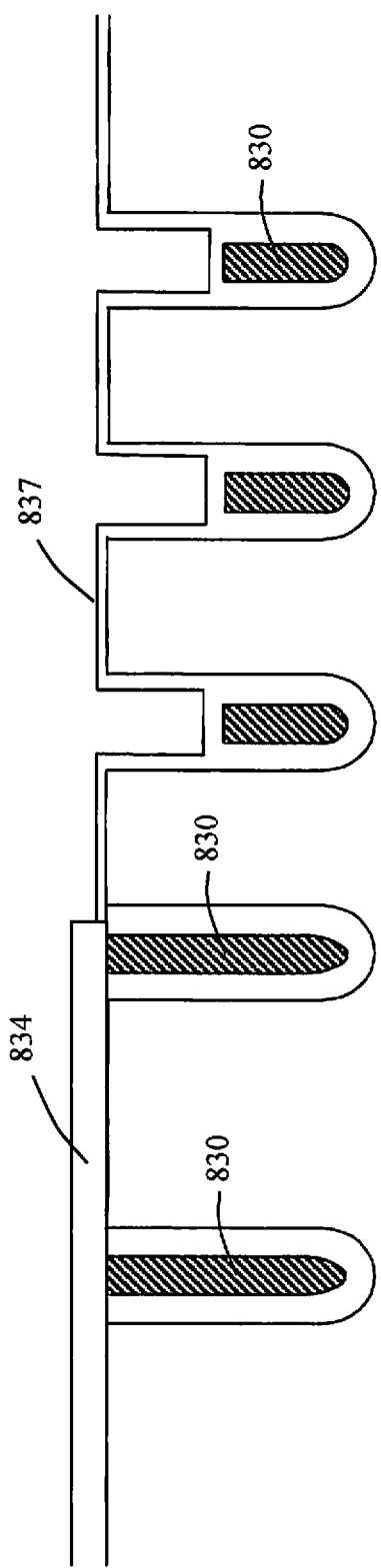
Figure 4K:
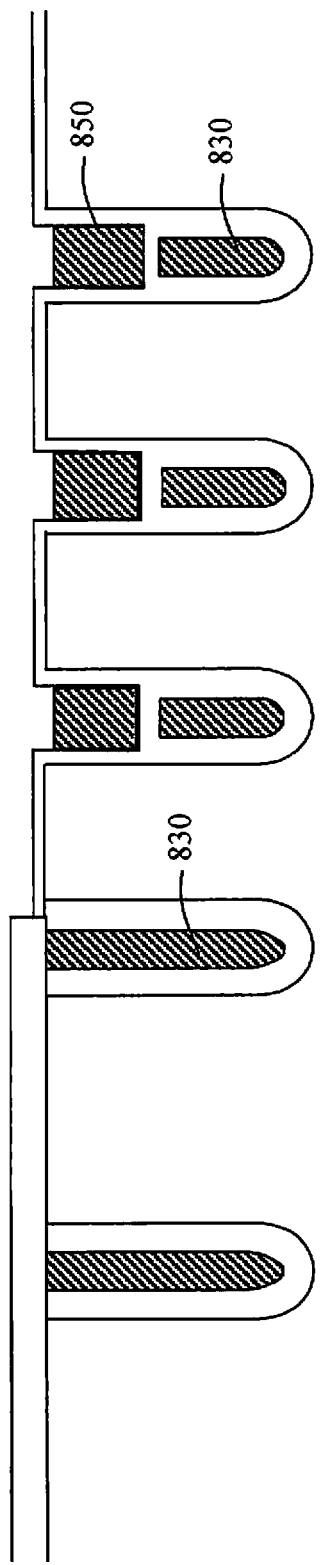
Figure 4L:
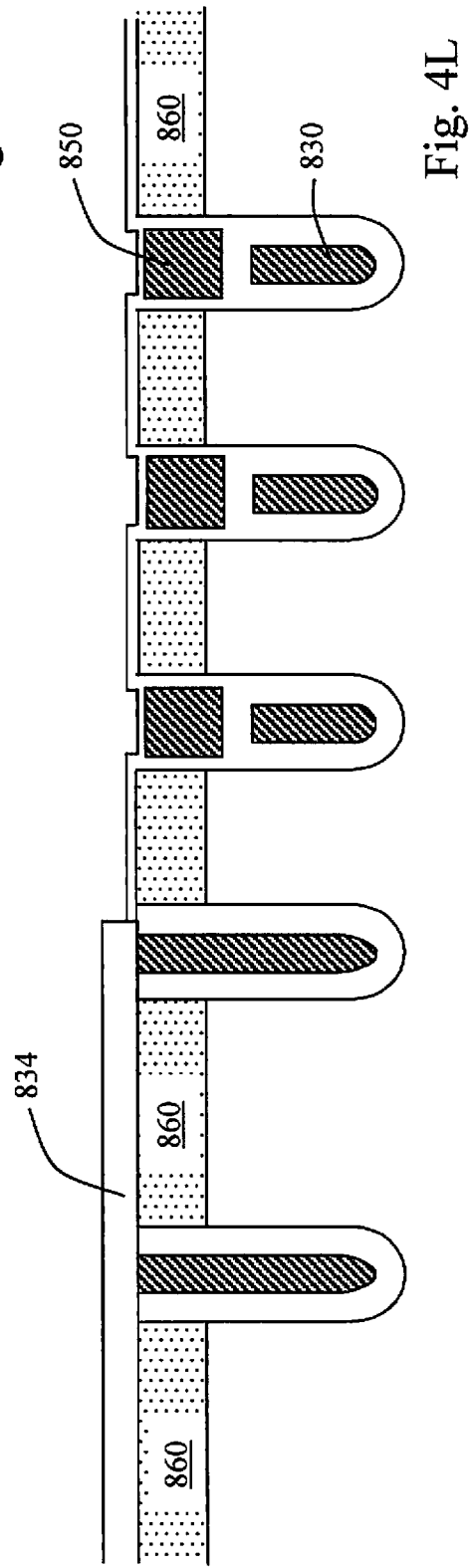
Figure 4M:
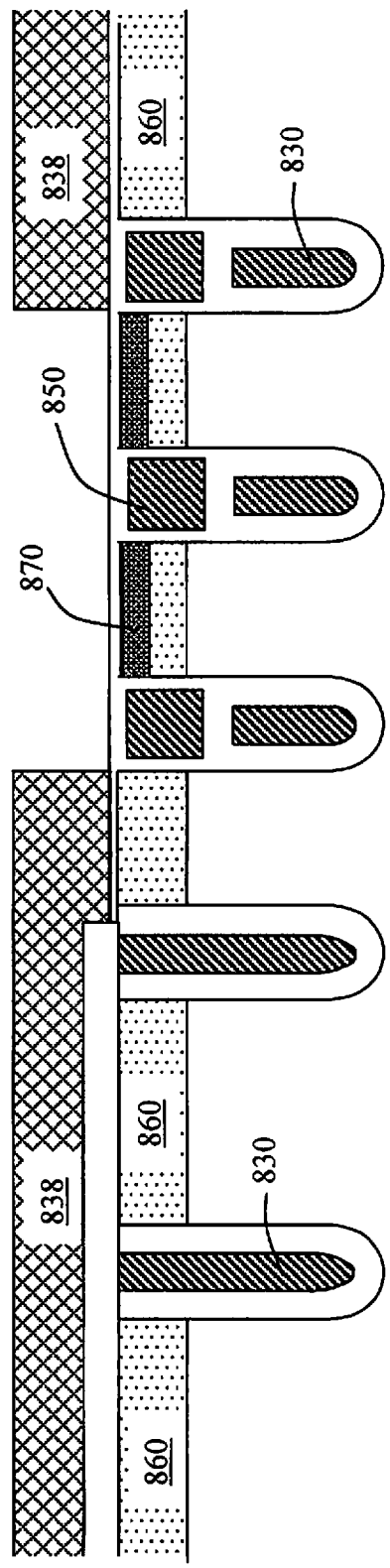
Figure 4N:
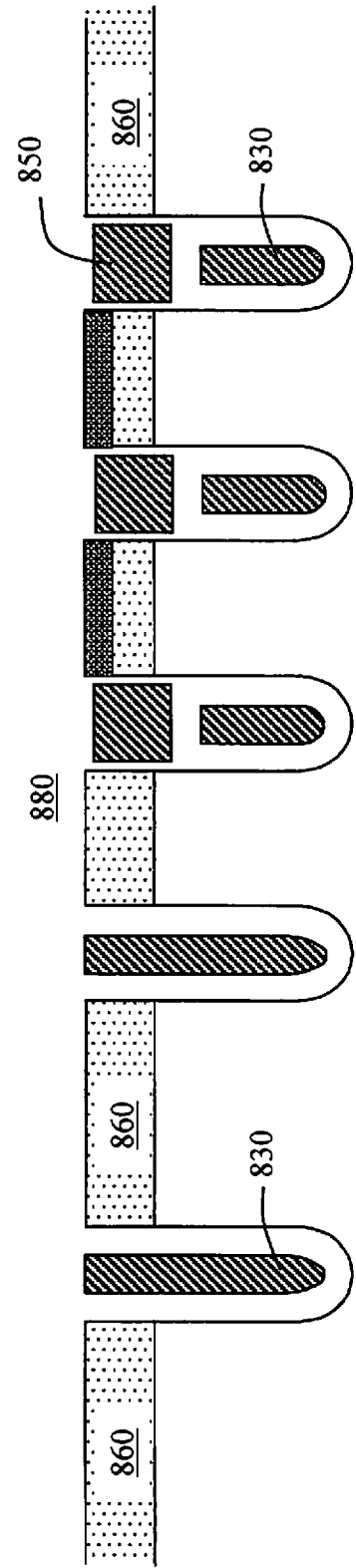
Figure 4O:
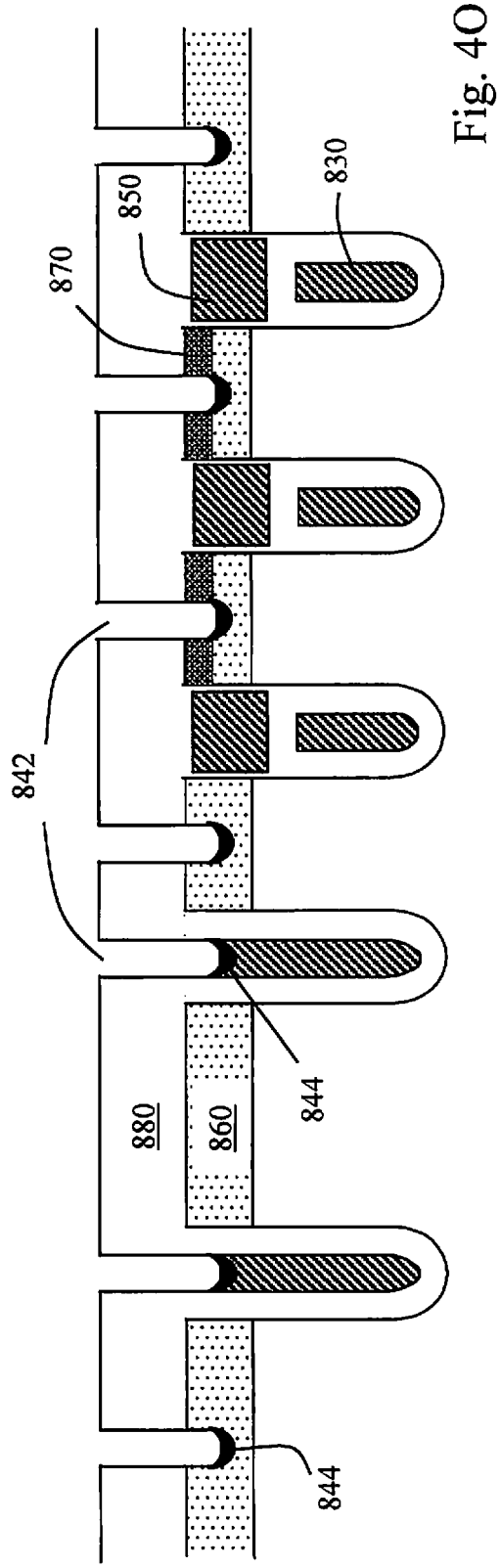
Figure 4P:
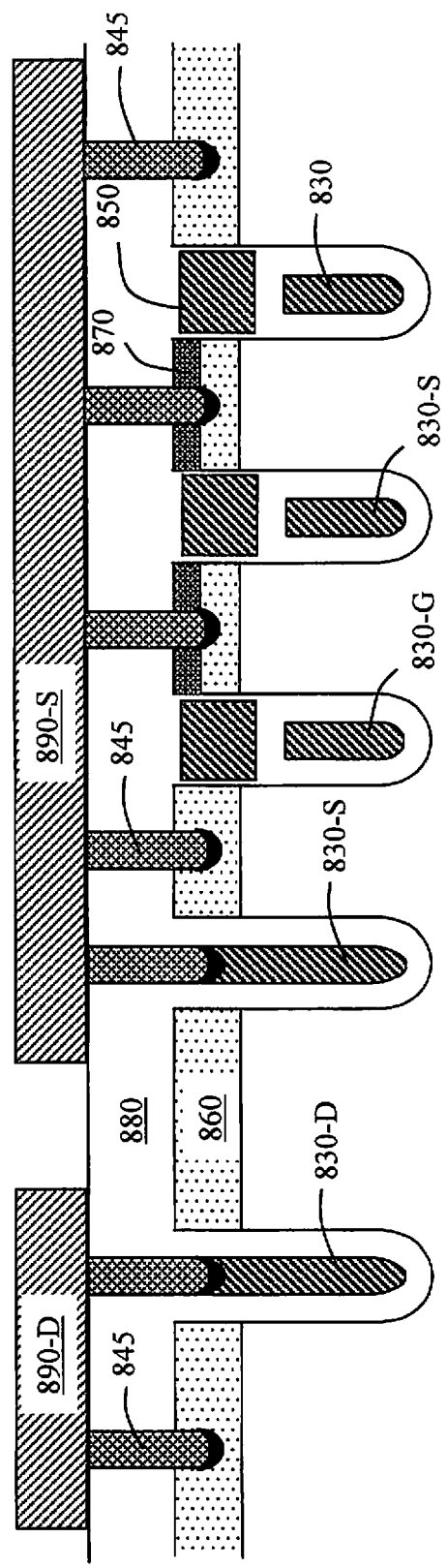

The fabrication steps of a MOSFET device 300 are shown in FIGS. 4A-4P. In FIG. 4A, a hard mask 812, such as an oxide layer of 2500 Å thick, is applied as first on a silicon substrate including a lightly doped epitaxial layer 810 on top a heavily doped epitaxial layer 805. A trench mask (not shown) is applied on top of the hard mask 812 to create an oxide hard mask 812 and then removed. Referring to FIG. 4B, a trench etch process is carried out to open a plurality of trenches 815 in the epitaxial layer 810. The net depth as required for both electrodes and the targeted oxide thickness determines the trench depth, which is about 1.5 micrometers to 6.0 micrometers. In FIG. 4C, the hard mask 812 is removed and a sacrificial oxidation is performed followed by an oxide etch to remove the damaged surface on the trench wall to smooth the sidewalls. Then a bottom oxidation is performed to grow a bottom oxide layer 817. The oxide layer 817 is grown to a thickness of about 800 Å to 5000 Å based on device optimization for low Rds and high breakdown voltage. A thicker oxide layer 817 here reduces the silicon surface electric field, allowing the use of higher doping and leading to lower Rds for the same breakdown rating.

In FIG. 4D, a source polysilicon layer 830 is deposited into the trenches 815. In FIG. 4E, a blanket polysilicon etch back is performed to etch back the source polysilicon layer 830. The source polysilicon layer 830 is etched back without a mask until its top surface is just below the top surface of the silicon substrate. In FIG. 4F, a second mask, i.e., a source polysilicon mask 832 is applied to cover a termination area of the silicon substrate. Then the source polysilicon layer 830 is etched back to remove the upper portion inside the trenches designated for gate electrode. The source polysilicon 830 is etched to a target depth using a timed etch-back process, for example the source polysilicon 830 is etched back to about 0.6 micrometers to 1.8 micrometers below the silicon substrate's surface. The source polysilicon mask 832 can be saved for further oxide etch back (wet etch) to facilitate the high density deposition (HDP) in later step.

The source polysilicon mask 832 is stripped using a wet etch. In FIG. 4G, HDP deposition followed by a chemical mechanical polishing (CMP) is carried out to form a HDP oxide layer 834, for example of about 3000 Å thick, in the upper portion of the trenches 815 and on the top surface of the silicon substrate. In FIG. 4H, a P-cover mask 836 is applied to cover the termination area of the silicon substrate. Then the HDP layer 834 and the thick oxide at the side wall of the trench are etched back to a target depth using a timed etch-back process, for example the source polysilicon 830 is etched back 1.0 micrometer below the silicon substrate's surface as shown in FIG. 4I.

In FIG. 4J, the P-cover mask 836 is then stripped off. A thin gate oxide layer 837, for example of about 500 Å to 1000 Å, is formed to cover the upper portion of trench wall and the top surface of the silicon substrate in the active region. A thin oxide on the gate trench sidewall provides the advantage of reducing gate threshold voltage. In FIG. 4K, a gate polysilicon layer 850 is deposited into the gate trenches and etched back to form the gate electrode. This gate polysilicon layer 850 is simply etched back using no mask, until its surface recesses below the top surface of the silicon substrate.

In FIG. 4L, a body dopant implant to form a plurality of body dopant regions 860 is carried out at the top portion of the silicon substrate. For example Boron dopants at a dose of about 5e12 $cm^{-2}$ to 2e13 $cm^{-2}$ are implanted at an energy level of about 60 keV to 300 keV. Body diffusion is then carried out to form the body regions 860. The body drive diffuses the dopant to the desired depth that is no deeper than the upper gate electrode.

Then a fourth mask, i.e., the photoresist as source mask 838, is applied to carry out a source dopant implant to form a plurality of source dopant regions 870. A local oxide thinning is performed before the source is implanted. In FIG. 4N, the photoresist layer 838 is removed, followed by applying an elevated temperature to diffuse the source regions 870. After a source drive, the LTO/BPSG layer 880 is deposited atop the silicon substrate. Then, a BPSG flow process is performed.

In FIG. 4O, a contact mask (not shown) is applied to open contact openings 842 through the LTO/BPSG layer 880 followed by implanting a contact dopant region 844 below the bottom surface of the contact trenches and then depositing a metal layer after the contact mask is removed (not shown). In FIG. 4P, a metal mask (not shown) is applied to pattern the metal layer into gate metal 890-G (not shown), source metal 890-S and drain metal 890-D. A plasma enhanced oxide and nitride deposition is carried out to form the oxide layer and the nitride layer as passivation layers atop the silicon substrate (not shown) to cover the gate metal 890-G, source metal 890-S and drain metal 890-D. Then, a passivation mask is applied to etch the passivation layer to electrically isolating the gate metal 890-G, source metal 890-S and drain metal 890-D (not shown). The wafer is also thinned and back metal is deposited to form the drain electrode (not shown).

Figure 5:
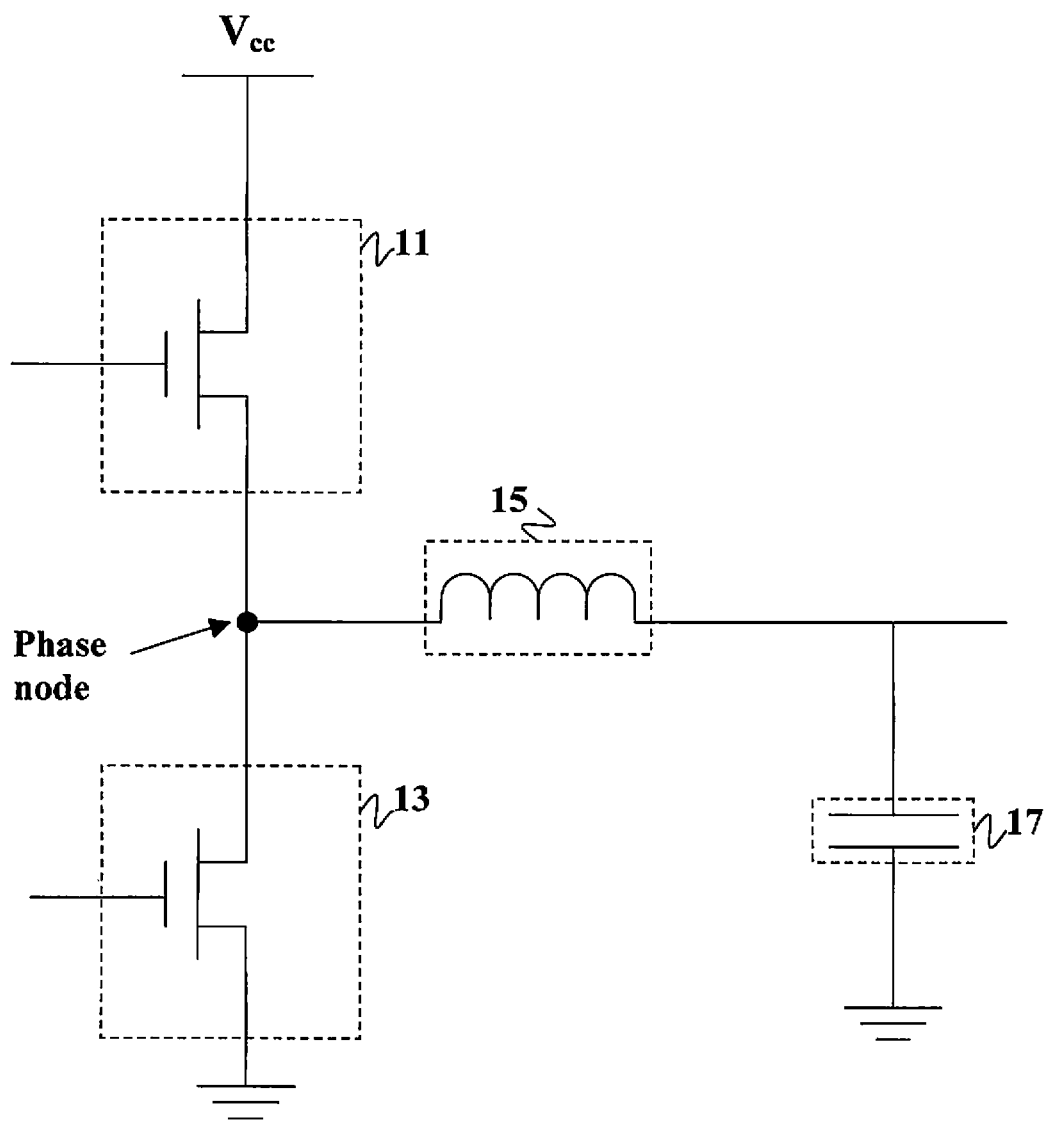
FIG. 5 is a circuit diagram of a synchronous buck converter.

The new layout of the SGT MOSFET device with some shielding bottom electrodes connected to the gate potential is implemented in high side MOSPET and/or low side MOSFET of a boots or buck converter to reduce the voltage peak of phase node. FIG. 5 is a circuit diagram of a synchronous buck converter 10 that includes a high-side switch 11 and a low-side switch 13, both of which are implemented as MOSFET devices. The high-side switch 11 is connected between a voltage source $V_{cc}$ and an inductor 15. The low-side switch 13 is connected between the inductor 15 and the ground. The switching behavior of the high-side switch 11 and the low-side switch 13 are driven by voltages applied to their respective gate electrodes. The converter 10 also includes a capacitance 17 connected between the inductor 15 and the ground. The high-side MOSFET charges the inductor and the low-side MOSFET, which replaces a conventional buck regulator's diode, provides a low-loss recirculation for the inductor current.

As the new layout of the SGT MOSFET device with some shielding bottom electrodes connected to the gate potential is implemented in the low side MOSFET, higher Crss is achieved that causes some cells shoot-through happening when VGS spikes higher than a threshold voltage (VTH) in local cells, resulting in smooth waveform, thus lower phase node peak ring. In addition, higher gate spike is occurred in local cells due to fast switching speed when the high side MOSFET turned on. As the new layout of the SGT MOSFET device with some shielding bottom electrodes connected to the gate potential is implemented in the high side MOSFET, higher Crss is achieved causing the high side MOSFET switching slower resulting smooth waveform, thus lower the phase node peak ring. In addition, the DC-DC converter requires lower specific on-resistance while not sacrificing unclamped inductive switching (UIS) capability or increasing switching losses. The SGT MOSFET device of the present invention is a solution of this requirement with the shielded gate help reduce the EMI.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, other conductive material instead of polysilicon may be used to fill the trenches. Accordingly, it is intended that the appended claims be interpreted as covering all alterations and modifications as fall within the true spirit and scope of the invention.

We claim:

1. A semiconductor power device comprising a plurality of power transistor cells each having a trenched gate disposed in a gate trench wherein said trenched gate comprising a shielding bottom electrode disposed in a bottom portion of the gate trench electrically insulated from a top gate electrode disposed at a top portion of the gate trench by an inter-electrode insulation layer wherein:
at least one of the transistor cells having the shielding bottom electrode functioning as a source-connecting shielding bottom electrode electrically connected to a source electrode of the semiconductor power device and at least one of the transistor cells having the shielding bottom electrode functioning as a gate-connecting shielding bottom electrode electrically connected to a gate metal of the semiconductor power device.

2. The semiconductor power device of claim 1 wherein:
a semiconductor substrate includes an active region and a termination region and said transistor cells in said active region having a source region disposed next to the trenched gate; and
at least one of said transistor cells constituting a source contacting cell comprising a source connecting trench opened in said source region filled with a conductive material for electrically connecting said source-connecting shielding bottom electrodes to a source metal disposed directly on top of said source connecting trench.

3. The semiconductor power device of claim 1 wherein:
said semiconductor substrate further includes an active region and a termination region and said gate trench further having gate-pad contact trenches disposed at the termination region and said gate trench further having a plurality gate runner trenches extended from the gate trenches in the active region to the gate-pad contact trenches in the termination region;
at least one of said gate-pad contact trenches functioning as a shielding-bottom-to-gate-pad contact trench filled with a conductive material for electrically connecting at least one of said gate connecting shielding bottom electrodes to a gate metal disposed directly on top of said shield-bottom-to-gate-pad contacting trench.

4. The semiconductor power device of claim 2 further comprising:
an insulation protective layer disposed on top of said semiconductor power device having a plurality of source openings on top of said source region and said source connecting trench, wherein a conductive material is filled in to said plurality of source openings for electrically connecting the source region and the source-connecting shielding bottom electrode to said source metal.

5. The semiconductor power device of claim 2 further comprising:
an insulation protective layer disposed on top of said semiconductor power device having a plurality of gate openings on top of said gate-pad contact trenches with said shielding-bottom-to-gate-pad contact trench in said termination region for electrically connecting trenched gates and the gate-connecting shielding bottom electrode to said gate-pad.

6. The semiconductor power device of claim 3 wherein:
at least one of said gate-pad contact trenches filled with a conductive material for electrically connecting only to the top gate electrode and is electrically shielding from the shielding bottom electrode disposed in a bottom portion of the trenched gates.

7. The semiconductor power device of claim 3 further comprising
a dummy trench disposed in a periphery of the termination area opened through an insulation protective layer disposed on top of said semiconductor power device wherein said dummy trench is filled with a metal plug on top of the conductive material filling in a bottom portion of the dummy trench wherein the metal plug in the dummy trench further contacts a drain metal covering the insulation protective layer at the periphery of the termination area to function as a channel stop of the semiconductor power device.

8. The semiconductor power device of claim 3 wherein:
said gate runner trenches further comprising the shielding bottom electrode disposed in a bottom portion of the gate runner trenches electrically insulated from the top gate electrode by the inter-electrode insulation layer.

9. The semiconductor power device of claim 1 wherein:
a ratio of a number of the transistor cells having the gate-connecting shielding bottom electrode electrically connected to a gate metal to a number of the transistor cells having the source-connecting shielding bottom electrode electrically connected to a source electrode is between 1% to 50%.

10. The semiconductor power device of claim 9 wherein:
a ratio of a number of the transistor cells having the gate-connecting shielding bottom electrode electrically connected to a gate metal to a number of the transistor cells having the source-connecting shielding bottom electrode electrically connected to a source electrode is 25%.

11. The semiconductor power device of claim 10 wherein:
a number of the transistor cells having the source-connecting shielding bottom electrode electrically connected to a source electrode of the semiconductor power device is about four times of a number of the transistor cells having the gate-connecting shielding bottom electrode electrically connected to a gate metal of the semiconductor power device.

12. The semiconductor power device of claim 9 wherein:
a ratio of a number of the transistor cells having the gate-connecting shielding bottom electrode electrically connected to a gate metal to a number of the transistor cells having the source-connecting shielding bottom electrode electrically connected to a source electrode is 50%.

13. The semiconductor power device of claim 12 wherein:
a number of the transistor cells having the source-connecting shielding bottom electrode electrically connected to a source electrode of the semiconductor power device is about twice of a number of the transistor cells having the gate-connecting shielding bottom electrode electrically connected to a gate metal of the semiconductor power device.

* * * * *